United States Patent [19]

Aslan

[11] Patent Number: 4,752,730
[45] Date of Patent: Jun. 21, 1988

[54] RADIATION MONITOR DIODE DETECTOR WITH CONSTANT EFFICIENCY FOR BOTH CW AND PULSED SIGNALS

[75] Inventor: Edward E. Aslan, Plainview, N.Y.

[73] Assignee: The Narda Microwave Corp., Hauppauge, N.Y.

[21] Appl. No.: 791,756

[22] Filed: Oct. 28, 1985

[51] Int. Cl.$^4$ ............................................. G01R 29/08
[52] U.S. Cl. ..................................... 324/95; 324/72.5; 324/119; 343/703
[58] Field of Search ............... 324/72.5, 95, 119, 132; 343/703

[56] References Cited

U.S. PATENT DOCUMENTS 4,588,993  5/1986  Babij et al. ...................... 343/703 X
4,611,166  9/1986  Aslan .............................. 324/119 X

OTHER PUBLICATIONS

IEEE Transactions on Instrumentation and Measurement, Hopfer et al., "An Ultra Broad-Band (200 kHz-26 GHz) High Sensitivity Probe".

*Primary Examiner*—Reinhard J. Eisenzopf
*Assistant Examiner*—Stephen M. Baker
*Attorney, Agent, or Firm*—Hoffmann & Baron

[57] ABSTRACT

An electric field sensitive probe capable of measuring both CW and pulsed signals with consistent efficiency using a diode detector connected to a dipole antenna in which a shunt capacitor is connected in parallel with the dipole and one or more resistive elements are connected in series between the diode and the dipole.

8 Claims, 2 Drawing Sheets

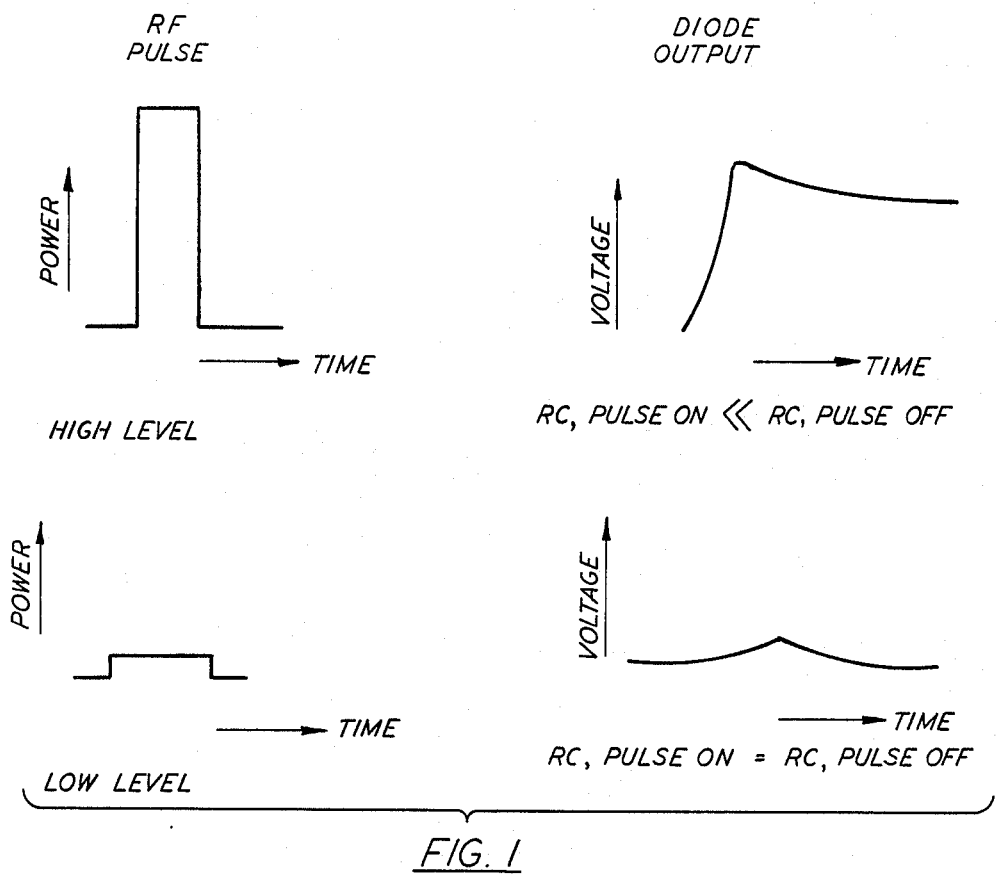
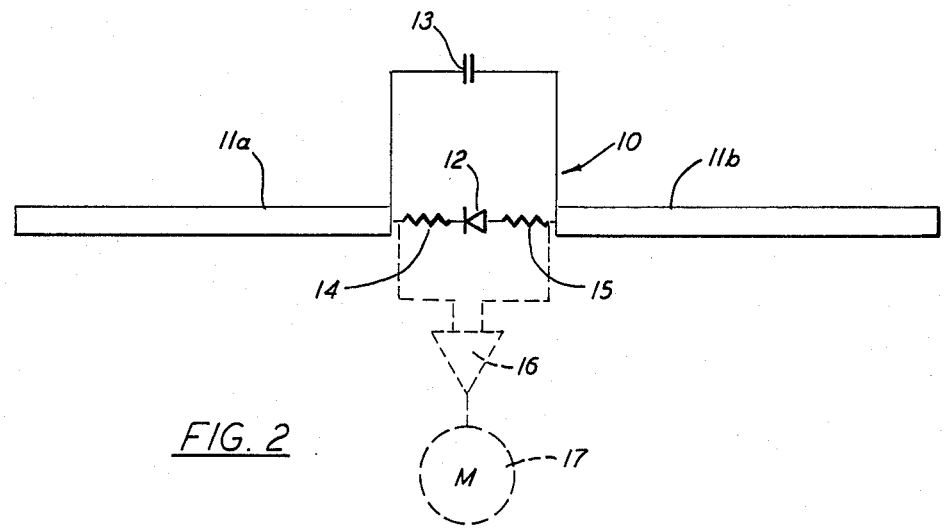

RADIATION MONITOR DIODE DETECTOR WITH CONSTANT EFFICIENCY FOR BOTH CW AND PULSED SIGNALS

This invention was made with Government support under contract, N60921-85-C-A201 awarded by the Department of the Navy.

BACKGROUND OF THE INVENTION

1. Field of the Invention

This invention relates to radiation monitors and more particularly to measuring instruments which can accurately monitor the radiation of electric fields resulting from both pulsed signals and continuous wave (CW) signals.

2. Description of the Prior Art

Semiconductor diode sensing elements are widely used in radiation monitoring instruments covering the lower range of frequencies of electrical fields from 0 through approximately 1.5 GHz, whereas thermocouple sensors operate most effectively over the frequency band ranging upward from approximately 300 MHz to 40 GHz and beyond. Diode sensors as well as thermocouple sensors are, therefore, required in any measuring system which covers the widest possible band width. It is now widely recognized that such radiation is harmful to humans and that the radiation surrounding certain frequencies of RF signals is more detrimental than at other frequencies.

Whereas thermocouple sensors respond accurately over their optimum frequency range to pulsed, variable CW and uniform-power CW signals, diode sensors do not. For example, radar signals having a characteristically short duty cycle can produce, particularly when the power level is high, substantial errors in diode sensors on the order of 10 to 100 times higher than CW signals of equal average power. Nevertheless, the existence of this error is scarcely recognized in the art and the cause of the error has not appeared in any literature known to the applicant. It follows that heretofore there has been no known way to eliminate the error.

The object of the invention, therefore, is to provide a diode sensor type instrument or probe for detecting and accurately measuring radiation surrounding electric fields where the inducing signals vary in their peak power, whether pulsed or variable CW.

SUMMARY OF THE INVENTION

The present invention is directed to radiation monitors utilizing diodes as sensors for making measurements on pulsed RF sources such as radar and also variable CW sources with the same degree of accuracy as measurements are now made on CW sources operating at more or less even power levels, such for example as microwave ovens. The invention is based on the recognition that diodes such as Shotky diodes used in electromagnetic radiation monitors differ in their response to low and high levels of power or power density. Low level power results in a square law detection characteristic and high power in a linear detection characteristic. This change of mode is a defect for measurement purposes and it arises from the change in video resistance of the diode with the level of RF current through the diode. The video resistance is drastically reduced at high levels of power and the resultant time constant is short, resulting in a rising wave form that tracks the pulse. When the signal being tested for radiation switches off at the end of the pulse, the diode video resistance reverts to its characteristic high value with the resultant long time constant. Thus the measurement signal now decays at a very slow rate as the capacitance of the measuring loop discharges thus maintaining the output at something close to peak value for an extended period. Low level pulsed or variable CW signals on the other hand see a uniformly high video resistance in the diode resulting in a uniformly long time constant during both the on and off periods of the pulse. In accordance with the invention a high resistance is inserted in series with the diode which is of the same order of magnitude as the low level video resistance of the diode thus limiting the level to which the circuit resistance can drop when the diode reverts to its peak detection mode.

The insertion of a high resistance in the loop increases the area of the loop because microwave chip resistors achieve high resistive values by means of long meandering resistive lines to obtain long length in a small space. This geometry results in a relatively large shunt capacitance which mitigates against its ability to reduce the induced loop current generated by the magnetic field at higher RF. This offsetting effect can be eliminated in accordance with the invention by inserting an additional resistor of much lower value in series with diode to act as a substantial resistance even at high RF and thus prevent coupling of the circuit loop into the magnetic field being measured.

BRIEF DESCRIPTION OF THE DRAWINGS

FIG. 1 illustrates the time constant characteristics of a diode sensing element used in radiation monitoring and measurement under the influence of both high level signals and low level signals.

FIG. 2 is a schematic diagram in which a basic dipole antenna diode detector circuit for measuring radiation modified to include the present invention.

Referring to FIG. 2 of the drawing, there is illustrated a low frequency (0 to 1.5 GHz) diode sensor circuit 10 connected between the two elements 11a and 11b of a dipole antenna. The circuit includes a diode 12, typically a Shotkey diode, connected across the dipole elements and a capacitor 13 also connected across the dipole elements in parallel with the diode. An output meter across the diode will measure a voltage proportional to the radiation surrounding the electric field picked up by the antenna, all as known in the art. The system to the extent just described, however, becomes inaccurate when the field being measured is pulsed such as the field from radar signals or from a variable CW signal when the signal levels are high. This effect is shown in the graphs of FIG. 1 in which it is seen that the time constant RC of the diode, when the signal level of a pulse is low is substantially equal when the pulse is turned on and the pulse is turned off. The voltage measured is, therefore, a direct analogue measurement of the radiation generated by the low level RF power pulse. When the pulse power level is high, however, it will be seen that the time constant RC when the pulse is on is very substantially less than the time constant when the pulse is off. This results in a high voltage peak which is maintained over a long time interval giving rise to an error in the measurement by a factor from 10 to 100. The error results from the change in video resistance of the diode with a consequent change in the level of RF current through the diode. Video resistance of a diode is the impedance to the RF rectified DC output signal. This resistance decreases with the height or power of the pulse, thus increasing the efficiency of the diode as a rectifier. The low resistance causes rapid charging of the overall circuit capacitance and the diode becomes a peak detector as opposed to providing an integrated average DC output.

Figure 3:
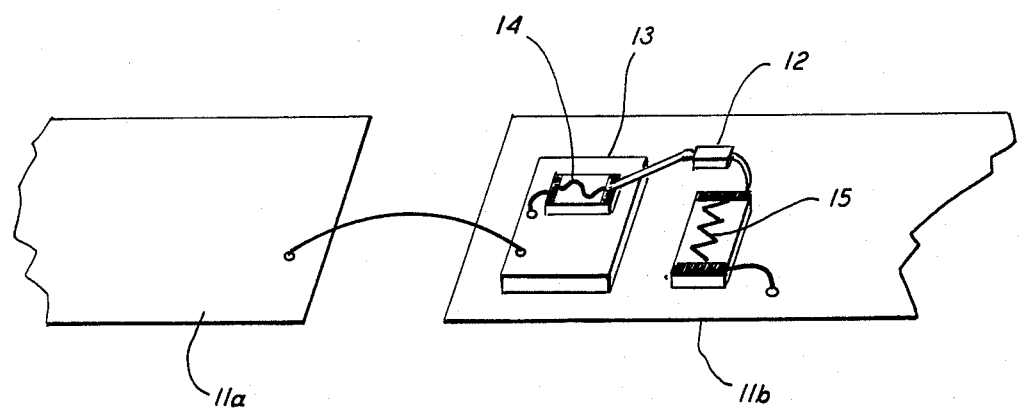
FIG. 3 shows one preferred placement of the elements constituting the configuration of FIG. 2.

In accordance with the invention, a resistor 14 having a relatively high resistance on the order of the low level video resistance of the diode is inserted in series between the diode 12 and one arm 11a of the dipole. For reasons described below, a second resistor 15 of relatively low value 15 on the order of 100 to 1,000 ohms is inserted in series with the diode 12, preferably connected between the other lead of the diode and other arm 11b of the dipole. Such circuitry will accurately measure pulsed and variable CW signals as well as uniform CW signals. It will be understood, however, that the insertion of the resistors 14 and 15 will decrease the output power level and to compensate for the decreased output level, an amplifier 16 can be inserted between the detector circuit 10 and the meter 17.

Figure 4:
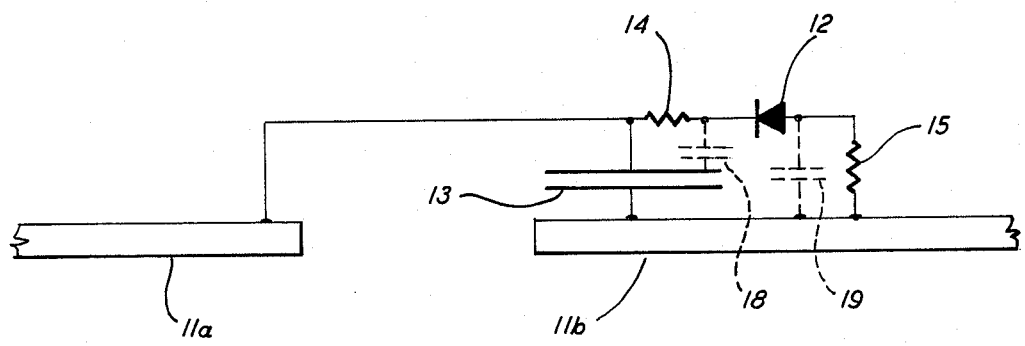
FIG. 4 is a schematic representation of a preferred embodiment of the invention as shown in FIG. 3 showing the distributed capacitance of the resistive elements.

Referring to FIGS. 3 and 4, a further embodiment of the invention is disclosed to decrease the coupling into the magnetic field which results when the high resistance 14 is inserted in series with the diode. This resistance increases the area of the circuit loop including the resistor 14, the diode 12 and the capacitor 13 which they shunt. The coupling would be effective at very high frequencies where the energy derived would be the greatest. As described above, the long meandering resistor line in the resistor 14 increases materially the shunt capacitance of the circuit which tends to negate its value to reduce the magnetic field induced loop currents at higher radio frequencies. This capacitance will not, however, effect the resistor's performance in the peak CW correction since the period of the video signals are 1,000 to 10,000 times longer than the RF period.

The introduction of the resistor 15 which has a relatively low value has a simpler geometry such that the shunt capacitance is low. This resistor will, therefore, act as a substantial resistance even at high radio frequencies and thus prevent the coupling into the magnetic field. A preferred way of mounting the circuit elements, therefore, as best seen in FIG. 3, is to mount all of the circuit elements on one arm of the dipole and to mount the high value resistor 14 on the capacitor 12.

The placement of the two resistors added in series with the diode is critical to performance. They must be physically located so that the capacitance 18 and 19 of the resistors to external circuitry (see FIG. 4) does not attenuate i.e. by pass the signal delivered to the diode. One solution to this problem is to place each resistor on the surface of its adjacent series element. Only the video signal is then responsive to the resistors, and attenuation of the RF signal does not occur.

I claim:

1. An electric field sensitive probe uniformly responsive to pulsed, variable CW and uniform CW power RF signals comprising a circuit including a diode and a first resistive element of relatively high resistance connected in series between the terminals of a dipole antenna, said resistive element having a resistance value which is generally equal to the low level video resistance of the diode, thereby to limit the level to which the circuit resistance can drop when the diode is operating in its peak detection mode, and shunt capacitance to bypass the RF signal around the resistive element to prevent attentuation of the signal delivered to the diode, and means to measure the signal across the series connected diode and resistive element.

2. An electric field sensitive probe as defined in claim 1 including a second shunt capacitance connected between the terminals of the dipole.

3. An electric field sensitive probe as defined in claim 2 including a second resistive element in series with the terminals of the dipole and diode and having a relatively low resistance value and a low shunt capacitance value to act as a substantial resistance at high radio frequencies to prevent coupling of the said circuit into the magnetic field to be measured.

4. An electric field sensitive probe as defined in claim 3 in which the first and second resistive elements are connected respectively in series with each terminal of the diode and the respective arms of the dipole.

5. An electric field sensitive probe as defined in claim 4 in which the first resistive element in series with the diode provides the shunt capacitance bypassing the RF signal.

6. An electric field sensitive probe as defined in claim 5 in which the first resistive element is mounted on the second shunt capacitance.

7. An electric field sensitive probe as defined in claim 6 in which the second shunt capacitance is mounted on the surface of one element of the dipole antenna.

8. An electric field sensitive probe as defined in claim 7 in which the first and second resistive elements, the capacitance and the diode are mounted in one element of the dipole antenna.

* * * * *